United States Patent [19]

Prentice

[11] Patent Number: 5,079,176
[45] Date of Patent: Jan. 7, 1992

[54] METHOD OF FORMING A HIGH VOLTAGE JUNCTION IN A DIELECTRICALLY ISOLATED ISLAND

[75] Inventor: John S. Prentice, Palm Bay, Fla.

[73] Assignee: Harris Corporation, Melbourne, Fla.

[21] Appl. No.: 498,642

[22] Filed: Mar. 26, 1990

[51] Int. Cl.⁵ .................... H01L 21/04; H01L 21/22
[52] U.S. Cl. .................... 437/15; 437/150; 437/31; 437/62; 437/154; 148/DIG. 10
[58] Field of Search ............. 437/26, 154, 153, 141, 437/31, 32, 63, 15, 150, 62

[56] References Cited

U.S. PATENT DOCUMENTS

| | | | |
|---|---|---|---|
| 3,755,012 | 8/1973 | George et al. | 437/141 |
| 3,818,583 | 6/1974 | Polata | 437/62 |
| 3,865,649 | 2/1975 | Beasom | 357/43 |
| 4,299,024 | 11/1981 | Piotrowski | 437/34 |
| 4,546,539 | 10/1985 | Beasom | 437/26 |
| 4,553,318 | 11/1985 | Chandrasekhar | 437/67 |
| 4,593,458 | 6/1986 | Adler | 437/62 |
| 4,729,008 | 3/1988 | Beasom | 357/43 |
| 4,740,477 | 4/1988 | Einthoven et al. | 437/141 |

Primary Examiner—Brian E. Hearn
Assistant Examiner—Michael Trinh
Attorney, Agent, or Firm—Barnes & Thornburg

[57] ABSTRACT

A high voltage junction is formed in a dielectrically isolated island by forming a second conductivity type region in a first conductivity type island wherein the second conductivity type region extends to and between a pair of opposed dielectric isolation wall. This shafts the boundaries to the dielectric walls and removes the low breakdown regions.

9 Claims, 3 Drawing Sheets

METHOD OF FORMING A HIGH VOLTAGE JUNCTION IN A DIELECTRICALLY ISOLATED ISLAND

BACKGROUND AND SUMMARY

The present invention relates generally to high voltage breakdown devices and more specifically to high voltage breakdown devices in dielectrically isolated islands. Although the invention described with respect to a diode since it is the simplest of the PN junction structures, the invention is also applicable to BJT's, DMOS SCR-GTO's and diffused resistors.

Electrical breakdown of reversed biased junctions occurs when the electric field over some distance exceeds a critical value. In this high field region, any free holes or electrons receive enough energy to generate electron-hole pairs though collision with the semiconductor atoms. These newly generated carriers then generate more carriers in the same way and is known as avalanche multiplication. This results in current many orders of magnitude larger than junction leakage current and increases exponentially with the electric field which is proportional to the applied voltage. The onset of this current defines the breakdown voltage which is a maximum voltage for useful operations.

Since the energy can be imparted to carriers over a distance less than one micron, the analysis will be in terms of peak electric field. If the peak electric field exceeds some critical value (approximately 30-35 volts per micron) anywhere within the device, breakdown will occur. The electric field can be calculated by solving Poison's equation:

$$\nabla \cdot \epsilon \bar{E} = \rho \qquad \text{Eq. 1}$$

wherein E is the electric field vector, the $\epsilon$ is the permittivity of the material and the $\rho$ is the charge density. Equation 1 is solved as a boundary value problem wherein the boundaries for a semiconductor devices are usually assumed to be field free surfaces of constant voltage. The electric field vector E and voltages V are related by $$V(r_1) - V(r_2) = -\int_{r_2}^{r_1} \bar{E} \cdot \bar{dr}. \qquad \text{Eq. 2}$$

The peak electric field E then as a function of applied voltage, the device shape, the doping concentration which determines the charge density and the material which determines the permittivity.

In most cases, the edge of a diffusion defined by a mask results in curvature in the plane of the PN junction. This curvature often causes an increase in electric field which reduces the breakdown voltage. Therefore breakdown usually occurs at the corners of diffusion at a lower voltage then the voltage which could be obtained if the corners were eliminated. The curvature of the junction makes one of the constant voltage boundary surfaces have a smaller surface area than the other. This smaller surface area causes the electric field lines to crowd together and thereby geometrically produces the increase in electric field.

Several structures have been developed which reduce electric field at the edge of a diffusion. These are:
1. large radius of curvature instead of sharp corners
2. guard rings
3. field plates (U.S. Pat. No. 4,713,681 Beasom)
4. equipontential rings (#1-4 discussed in Semiconductor Devices, Chapter 2 by S. Ghandi, Wiley & Sons, 1977)
5. field plates over stepped oxide ("Structural Analysis and Experimental Characteristics of High-Voltage Bipolar Transistors with Shallow Junctions", Sakurai & Ohno, Jap. J. of Applied Phy., Vol. 23, no 4, April 1984, pp 415-419)
6. floating metal rings ("Floating Metal Rings . . . ", Yilmaz, IEEE ED letters, Vol EDL-6, no 11, Nov. 1985, p 600)
7. junction termination extensions ("Multiple-Zone Single-Mask Junction Termination Extension . . .", Tantraporn & Temple, IEEE tran ED, Vol ED-34, no 10, Oct. 1987, p 2200-2210)
8. shallow surface layer implants (Harris patent file SE-368 Beasom, U.S. Pat. No. 4,975,751 issued Dec. 4, 1990).

Although these prior art solutions have produced high breakdown voltage devices, they have generally required substantial amount of surface area as well as complex masking. The field plates for example require tailored oxide thickness. The guard and floating metal rings need anode to cathode spacing of greater than 100 microns. The breakdown voltage of these devices are effected by the potential of the substrate relative to the island. For substrate bias between that of the anode and the cathode, the cathode potential is the worst case voltage assuming P diffusion into N island.

Thus is an object the present invention to provide a high voltage junction, dielectrically isolated islands which is not process dependent.

Another object of the present invention is to provide a high voltage junction in dielectric isolated islands which is not dependent on oxide thickness and allow smaller spacing ground rules.

An even further object of the present invention is provide a high voltage junction dielectrically isolated islands which is less effected by substrate bias.

These and other objects of the invention are attained by introducing impurities of a second conductivity type into a dielectrically isolated island of a first conductivity type so as to form a first region of the second conductivity type extending to and between a pair of opposed dielectric isolation walls. This shifts the boundaries to the dielectric walls and removes the low breakdown regions. Impurities of the second conductivity type are introduced into the first region to form a second contact region of higher impurity concentration than first region. First conductivity type impurities are introduced into the dielectric island to form a island contact region spaced from the first region. These contacts regions define a current path transverse to the lateral extent of the first region. The first region is formed having edges which diverge, horizontally and vertically to and towards the opposed dielectric walls. The impurities are introduced through an opening in a mask. The mask for the first region is sufficiently close to the opposed dielectric walls such that the impurities that are introduced therethough diffuse to the opposed dielectric side walls. The lateral edge of the mask region is within approximately 0.7 times the vertical depth of the to-be-formed first region from the dielectric side walls.

Other objects, advantages and novel features of the present invention will become apparent from the following detailed description of the invention when con-

DETAILED DESCRIPTION OF THE DRAWINGS

Figure 1:
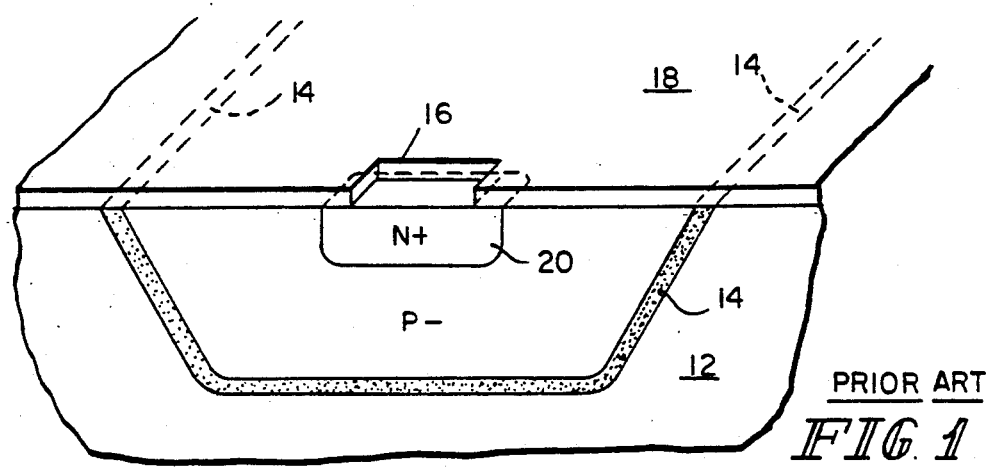
FIGS. 1 and 2 are cross sectional perspective views of stages of the process of fabrication a PN injunction according to the principals of the prior art.

All the elements of the drawing which have the same purpose and perform the same function have the same unit and digit value. Also the use of the particular conductivity A type is used for illustrative purpose only and not way of limitation.

Figure 2:
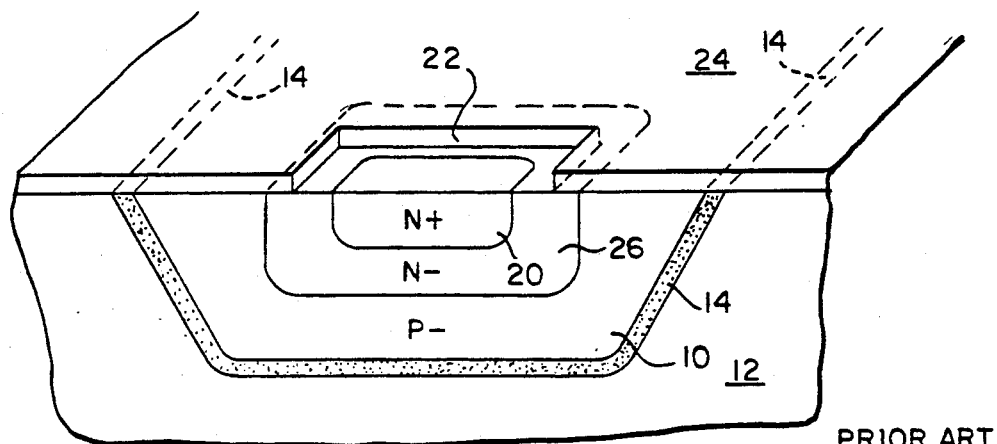
Figure 3:
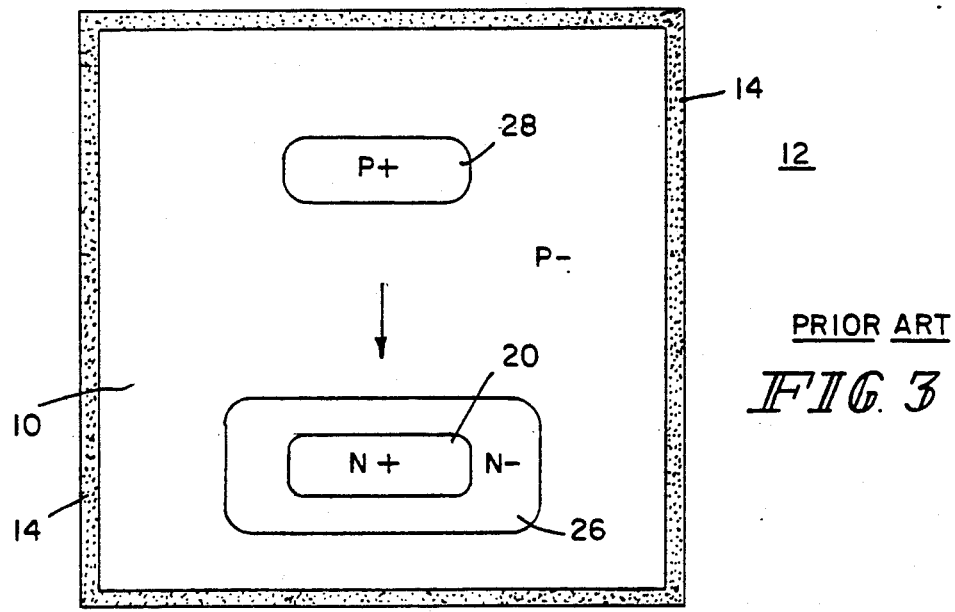
FIG. 3 is a plan view of the resulting device of FIGS. 1 and 2 of the prior art.

A P type island 10 is isolated from a support substrate 12 by a dielectric layer 14. N type impurities are introduced though an opening 16 in a mask 18 to form a first N+ region 20 in the dielectrically isolated island 10 as illustrated in FIG. 1. A second N type impurities are introduced through a second opening 22 in a second mask 24 to form the N− region 26 in the dielectric isolated P region 10. The N− region 26 has a lower impurity concentration region than in the N+ region 20. The N− region 26 forms a PN injunction in the dielectrically isolated region 10, whereas the N+ region 20 forms a contact region for the N− region 26. The structure is illustrated in FIG. 2. P+ impurities are then introduced to form a P+ contact region 28 in the dielectrically isolated region 10 as illustrated in FIG. 3. The current path between the N+ contact region 20 and the P+ contact region 28 is illustrated by an arrow in FIG. 3 being transverse to the lateral extent of these regions as well as the N− region 26. As previously discussed, the curvature of the diffused region 26 horizontally and vertically produce regions of lower breakdown. Typically the N+ region 20 and N− region 26 are spaced from the lateral dielectric walls 14 by tens to hundreds of microns. Alternatively, the N− region 26 be formed before the N+ region 20.

Figure 4:
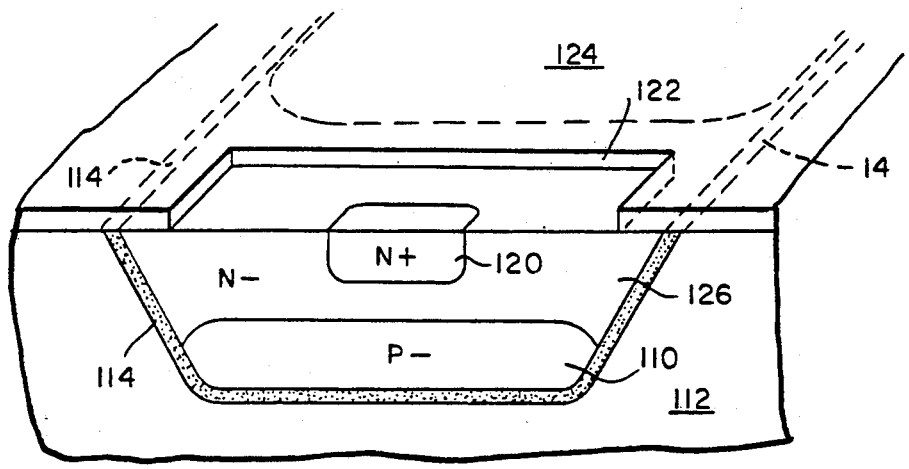
FIG. 4 is a cross-sectional perspective view of a process forming a PN junction according the principles to the present invention.

A PN injunction formed according to the principles of the present invention would use the same process step of FIG. 1 to produce an N+ region 120 in the dielectrically isolated island 110. The formation of the second N− region is modified as illustrated in FIG. 4, by forming a substantially larger mask opening 122 in the mask 124. The mask opening 122 has been extended laterally to be substantially closer to opposed dielectric walls 114 traversed to the direction of the current flow. The dimension of the opening 122 in the current flow direction would be substantially that of FIG. 2. N type impurities are introduced through the opening 122 to form the regional 126.

Figure 5:
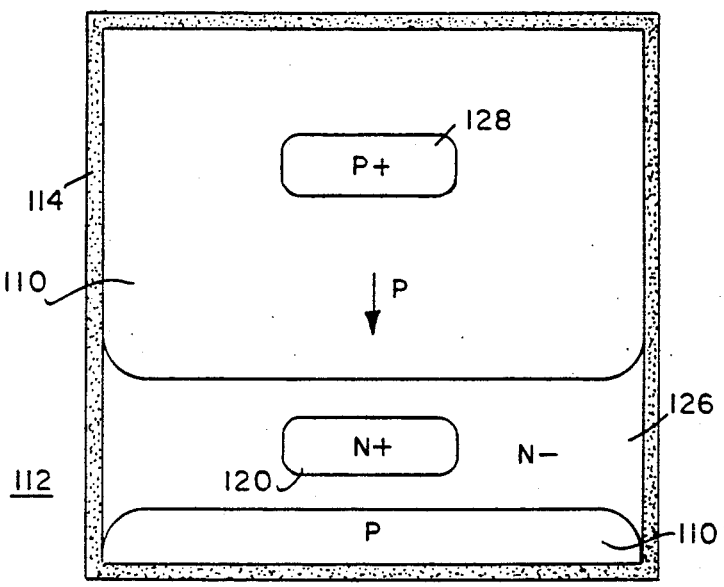
FIG. 5 is plan view of a diode formed according to the principles of the present invention.

As noted in FIG. 4, the N− impurities and region 126 extends down from a substantial horizontal portion or diverge towards the dielectric isolation walls 114. As illustrated in the plan view of FIG. 5, the edges of the region 126 also diverge at their ends horizontally toward the dielectrical isolation walls 114. The N− region 126 extends to and between the dielectrical isolation walls 114. Thus not only has the curvature of the region 126 at its lateral extent been eliminated, but a reverse curvature has been produced. This specific diverging edges or geometry of the region 126 reduces the electric field concentration in 126 by increasing the constant voltage boundary surface area. The increasing boundary surface area helps off set the higher than region 110 impurities concentration of region 126.

The resulting structure 126 diverging in both horizontal and vertical directions result from forming the lateral edge of the mask 122 as closed as possible to the dielectric isolated walls 114 and that the walls act as a reflection for the diffusions impurities. The distance of the lateral edge of the mask 122 from the dielectric walls 114 should be no more than approximately 0.7 times the vertical junction depth of the second region. The mask edge of course could be closer and may even overlap the dielectrically isolated wall 114.

In experiments run with particular devices, having an island 110 (N-type) resistance in the range of the 10 to 20 ohm-cm and the region 126 (P-type) having a surface concentration with approximately $3 \times 10^{15}$ atoms per cm cubed and a junction depth of 19 microns, a breakdown voltage of over 550 volts were obtained. This was achieved with spacing between contact region 120 and 128 as small as 45 microns. This is approximately half of the spacing required for guard or floating metal rings. This was for worse case substrate bias. Breakdown well over 600 V was achieved for other substrate bias.

Another advantage of lateral extent region 126 intersecting the dielectric region 114 is that the metal interconnect to the contact 120 can leave the island by following the region 126 to the island edge. The region 126 prevents the mental interconnect from reducing the breakdown since its act as an electrostatic shield between the island and the interconnect metal.

Figure 6:
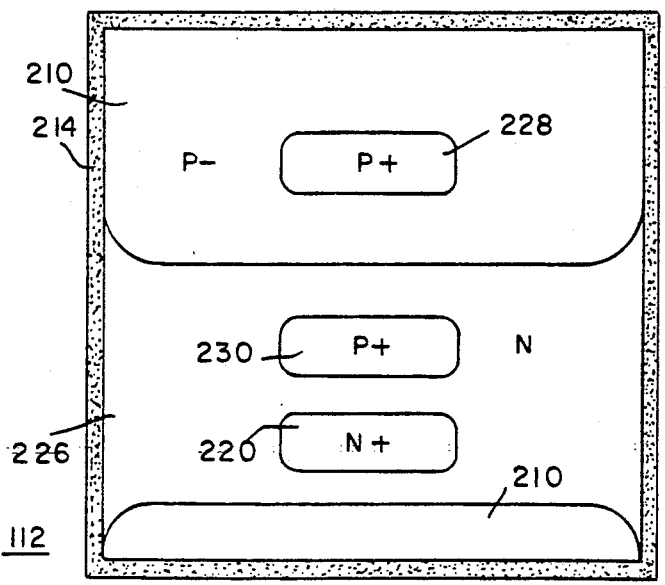
FIG. 6 is a plan view of a vertical transistor formed according to the principles of the present invention.

A vertical bipolar PNP transistor is illustrated in FIG. 6. The island P-210 is the collector with P+ collector contact 228. N region 226 is the base with N+ base contact 220 and a P+ emitter region 230 is formed in the base 226. The base-collector junction is formed to have the high breakdown PN junction as described above.

Figure 7:
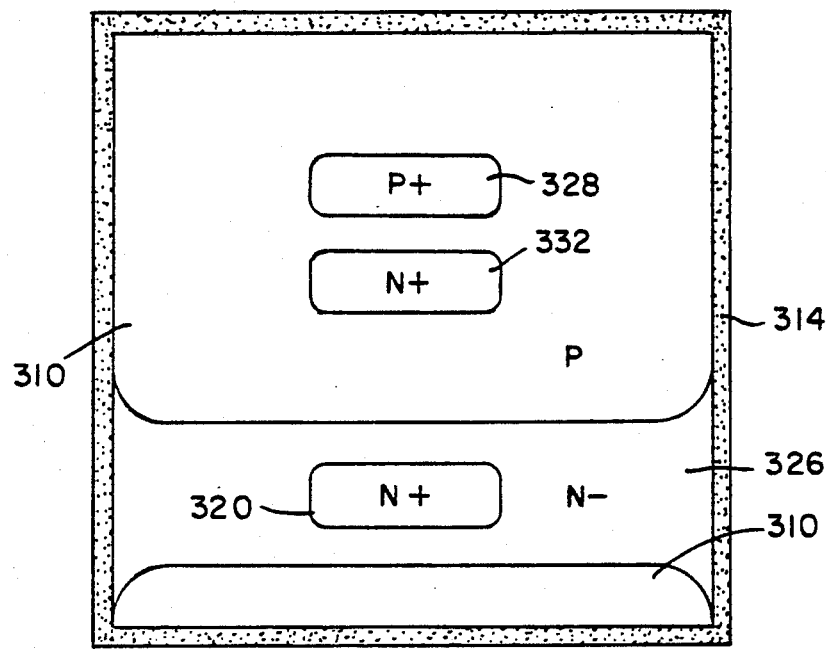
FIG. 7 is a plan view of a lateral transistor formed according to the principles of the present invention.

A lateral NPN bipolar transistor is illustrated in FIG. 7. The P island 310 is the base with a P+ base contact 328. N− region 326 forms the collector with N+ collector contact 320. N+ region 332 forms the emmitter. The collector-base junction is formed to have the high breakdown PN junction as described above.

Figure 8:
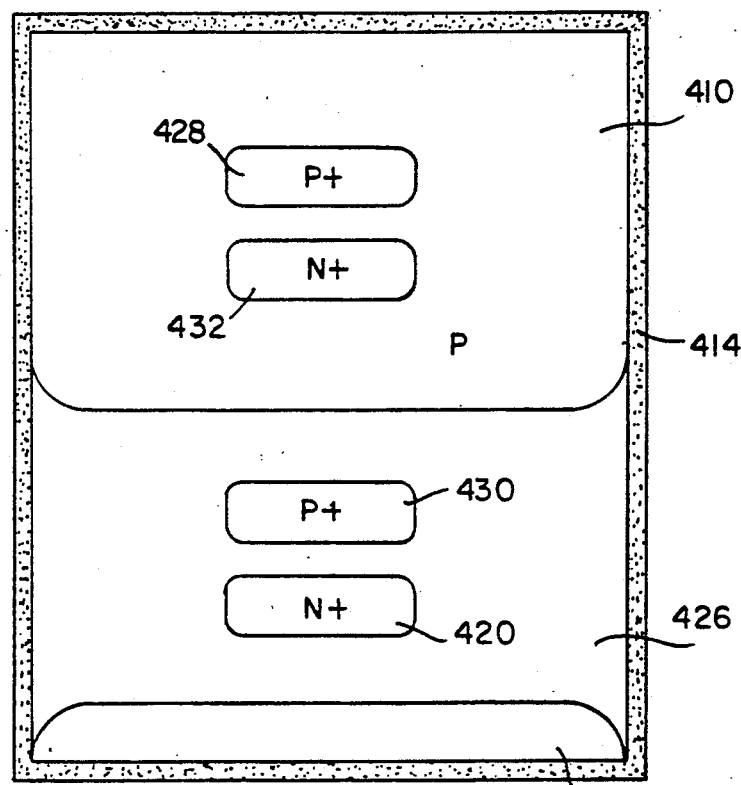
FIG. 8 is a plan view of an SCR formed according to the principles of the present invention.

An SCR is illustrated in FIG. 8. N− anode gate 426 forms a high breakdown PN junction with cathode gate 410. P+ region 428 forms the cathode gate contact and N+ region 420 forms the anode gate contact. P+ region 430 form the anode and N+ region 432 forms the cathode.

For all the embodiments of FIGS. 4-8, the conductivity types may be reversed.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A method of forming a high voltage PN junction in dielectrically isolated island of a first conductivity type comprising:

introducing impurities of a second conductivity type into said island of said first conductivity type to form a first region having a first impurity concentration;

introducing impurity of said second conductivity type into said island to form a second region having a second impurity concentration less that said first impurity concentration and separating said first region from said island, said second region extending lateral to a pair of opposed dielectric walls of said dielectrically isolated island so that a junction boundary of said second region and said island extends to said pair of opposed dielectric walls.

2. A method according to claim 1 including forming a contact to said island longitudinally spaced from said first and second regions whereby a primary current path is transverse to said lateral extent of said second region.

3. A method according to claim 1 wherein said second region is formed having edges which diverge horizontal and vertically adjacent to and towards said opposed dielectric walls.

4. A method according to claim 1 wherein said impurities are introduced through openings in masks and are diffused to form said first and second regions of appropriate dimensions.

5. A method according to claim 1 wherein said second regions form a PN diode junction with said island and said first region is a contact region.

6. A method according to claim 1
wherein said second region forms a base-collector junction with said island and said first region is a base contact region; and including introducing impurities of said first conductivity type into said second region to form an emitter region.

7. A method of forming a high voltage PN junction in a dielectrically isolated island of a first conductivity type comprising:

introducing impurities of a second conductivity type through a first mask opening into said island of said first conductivity type to form a first region having a first impurity concentration;

introducing impurity of said second conductivity type through a second mask opening larger than said first mask opening into said island to form a second region having a second impurity concentration less that said first impurity concentration and separating said first region from said island, said second region extending lateral to a pair of opposed dielectric walls of said dielectrically isolated island.

8. A method according to claim 7 wherein lateral edges of said second mask opening are sufficiently close to said opposed dielectric walls such that impurities introduced through said second mask opening diffuse to said opposed dielectric walls.

9. A method according to claim 8 wherein said lateral edges of said second mask is within approximately 0.7 times the vertical depth of said second region from said dielectric walls.

* * * * *